United States Patent
Sun et al.

(10) Patent No.: US 10,742,234 B2
(45) Date of Patent: Aug. 11, 2020

(54) CODE BLOCK GROUP DEFINITION CONFIGURATION FOR WIRELESS COMMUNICATION

(71) Applicant: QUALCOMM Incorporated, San Diego, CA (US)

(72) Inventors: Jing Sun, San Diego, CA (US); Jing Jiang, San Diego, CA (US); Hao Xu, Beijing (CN)

(73) Assignee: QUALCOMM Incorporated, San Diego, CA (US)

(*) Notice: Subject to any disclaimer, the term of this patent is extended or adjusted under 35 U.S.C. 154(b) by 29 days.

(21) Appl. No.: 15/919,111

(22) Filed: Mar. 12, 2018

(65) Prior Publication Data

US 2018/0269898 A1 Sep. 20, 2018

Related U.S. Application Data

(60) Provisional application No. 62/471,855, filed on Mar. 15, 2017.

(51) Int. Cl.
| | |
|---|---|
| *H03M 13/09* | (2006.01) |
| *H04L 1/18* | (2006.01) |
| *H04L 1/00* | (2006.01) |
| *H03M 13/00* | (2006.01) |

(52) U.S. Cl.
CPC ....... *H03M 13/09* (2013.01); *H03M 13/6306* (2013.01); *H04L 1/0083* (2013.01); *H04L 1/1812* (2013.01); *H04L 1/1887* (2013.01)

(58) Field of Classification Search
CPC . H03M 13/09; H03M 13/6306; H04L 1/0083; H04L 1/1893; H04L 1/1812; H04L 1/1887
See application file for complete search history.

(56) References Cited

U.S. PATENT DOCUMENTS

| | | | | |
|---|---|---|---|---|
| 2011/0080975 | A1* | 4/2011 | Toda | H04B 7/0413 375/295 |
| 2015/0067435 | A1* | 3/2015 | Yerramalli | H04L 1/0006 714/748 |
| 2015/0319771 | A1* | 11/2015 | Hill | H04W 4/70 370/330 |
| 2016/0329995 | A1* | 11/2016 | Jiang | H04L 1/1861 |
| 2017/0026297 | A1* | 1/2017 | Sun | H04L 47/25 |
| 2017/0294990 | A1* | 10/2017 | Xu | H04L 1/00 |
| 2018/0109355 | A1* | 4/2018 | Werner | H04L 1/0089 |
| 2019/0123849 | A1* | 4/2019 | Baldemair | H04L 1/0003 |
| 2019/0261335 | A1* | 8/2019 | Peng | H04L 5/0053 |

OTHER PUBLICATIONS

International Search Report and Written Opinion—PCT/US2018/022207—ISA/EPO—dated Jun. 27, 2018.

* cited by examiner

*Primary Examiner* — Thien Nguyen
(74) *Attorney, Agent, or Firm* — Loza & Loza, LLP

(57) ABSTRACT

Aspects of the present disclosure provide various apparatuses and methods for retransmitting code blocks (CBs) and code block group (CBG) definitions that can improve CBG-based data retransmission efficiency. When an interference pattern is bursty and does not align with CBG or symbol boundary, the disclosed CBG definitions can reduce or avoid retransmission of successfully received CBs along with the CBs that need to be retransmitted.

30 Claims, 12 Drawing Sheets

CODE BLOCK GROUP DEFINITION CONFIGURATION FOR WIRELESS COMMUNICATION

PRIORITY CLAIM

This application claims priority to and the benefit of U.S. provisional patent application No. 62/471,855 filed in the United States Patent and Trademark Office on Mar. 15, 2017, the entire content of which is incorporated herein by reference as if fully set forth below in its entirety and for all applicable purposes.

TECHNICAL FIELD

The technology discussed below relates generally to wireless communication systems, and more particularly, to code block group designs used in wireless communication.

INTRODUCTION

In some wireless communication networks, a physical layer receives payload data from a medium access control (MAC) layer as one or more transport blocks. The size of a transport block (TB) may be chosen based on various parameters. Different TB sizes may be used for different scenarios and applications. For example, some of the parameters for determining TB size may include an amount of data available for transmission, a modulation and coding scheme (MCS), and resources (e.g., time and frequency resources) available in a slot for transmitting the data. A device may transmit one TB using multiple time domain symbols in a slot. When one or more symbols is not successfully transmitted to a receiving device, the device may retransmit the corresponding TB using a hybrid automatic repeat request (HARQ) process that is known in the art. A TB may be divided into smaller code blocks (CB), that are encoded with an error correcting block code to add redundancy to the information. Exploitation of this redundancy in the encoded information can improve the reliability of the transmitted message, enabling correction for bit errors that may occur due to noise or interference.

In the next generation networks, for example 5G new radio (NR), multiple code blocks (CBs) may be grouped or arranged into multiple code block groups. A TB may include multiple code block groups, each including one or more CBs. In some examples, a code block group (CBG) may include one CB, all CBs of a TB, or any number of CBs of a TB. In the next generation networks (e.g., 5G NR), HARQ retransmission may be performed in CBG unit, instead of the entire TB.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

One aspect of the present disclosure provides a method of wireless communication operable at a scheduling entity. The scheduling entity encodes a transport block (TB) into a plurality of first code blocks (CBs) for transmission in a slot. Based on a code block group (CBG) definition, the scheduling entity groups the plurality of first CBs into a plurality of code block groups (CBGs). The CBGs include at least one of: CBGs overlapping with each other by one or more CBs or one or more CBGs each restricted to a corresponding symbol of the slot. The scheduling entity transmits the plurality of first CBs grouped into the plurality of CBGs.

Another aspect of the present disclosure provides a method of wireless communication operable at a user equipment (UE). The UE receives, from a scheduling entity, information on a CBG definition for grouping a plurality of first CBs. The UE receives in a slot the plurality of first CBs grouped into a plurality of CBGs. The CBGs include at least one of CBGs overlapping with each other by one or more CBs, or one or more CBGs each restricted to a corresponding symbol of the slot. The UE decodes the plurality of first CBs to recover a transport block.

Another aspect of the present disclosure provides a scheduling entity for wireless communication. The scheduling entity includes a communication interface configured for wireless communication, a memory, and a processor operatively coupled with the communication interface and the memory. The processor and the memory are configured to encode a TB into a plurality of first CBs for transmission in a slot. The processor and the memory are configured to group, based on a CBG definition, the plurality of first CBs into a plurality of CBGs. The CBGs include at least one of CBGs overlapping with each other by one or more CBs or one or more CBGs each restricted to a corresponding symbol of the slot. The processor and the memory are configured to transmit the plurality of first CBs grouped into the plurality of CBGs.

Another aspect of the present disclosure provides a user equipment (UE) for wireless communication. The UE includes a communication interface configured for wireless communication, a memory, and a processor operatively coupled with the communication interface and the memory. The processor and the memory are configured to receive, from a scheduling entity, information on a CBG definition for grouping a plurality of first CBs. The processor and the memory are configured to receive in a slot the plurality of first CBs grouped into a plurality of CBGs. The CBGs include at least one of CBGs overlapping with each other by one or more CBs, or one or more CBGs each restricted to a corresponding symbol of the slot. The processor and the memory are configured to decode the plurality of first CBs to recover a transport block.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

Figure 1:
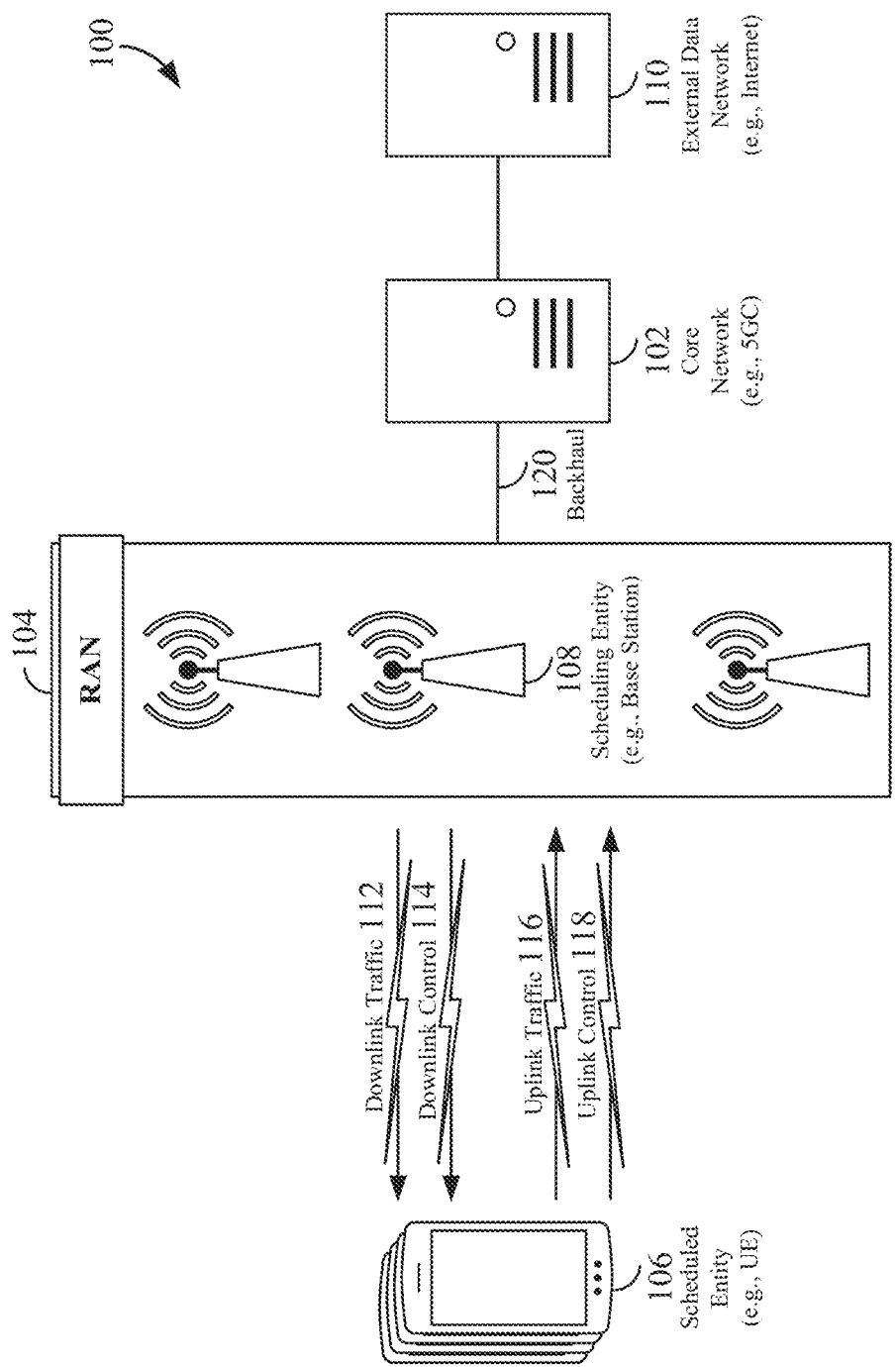
FIG. 1 is a schematic illustration of a wireless communication system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

In next generation wireless networks, a transport block (TB) may include multiple code blocks (CBs) that are grouped in different code block groups. At a transmitting device, a TB is passed from an upper layer (e.g., MAC layer) to a physical layer (layer 1) for transmission. In 5G new radio (5G NR), an interference pattern may be more bursty and/or much shorter in duration than a time slot, and may affect only some CBs of a TB. In some examples, bursty interference may be caused by high priority traffic such as ultra-reliable and low-latency communication (URLLC) that uses a mini-slot. If a code block (CB) is not successively received by a receiver, the CB may be retransmitted. To increase efficiency, data retransmission may be performed in code block group (CBG) unit. For example, in a CBG unit based retransmission, only CBGs containing at least one CB that was not transmitted successfully are retransmitted, while other CBGs need not be retransmitted.

In various aspects of the disclosure, a CBG may include any number of CBs. In one example, a CBG may include one CB. In another example, a CBG may include all CBs of a TB. In that case, the CBG may be the same as a TB. By retransmitting only the affected CBG(s) of a TB, retransmission efficiency may be increased. In various examples, performing data retransmission in CBG level can provide a balance between retransmission feedback overhead and retransmission efficiency.

Aspects of the present disclosure provide various apparatuses and methods for retransmitting CBs and CBG definitions that can improve CBG-based data retransmission efficiency. In particular, when the interference pattern is bursty and does not align with CBG or symbol boundary, the disclosed CBG definitions can reduce or avoid retransmission of successfully received CBs along with the CBs that need to be retransmitted. In particular, the interference pattern may be a bursty interference that is significantly shorter in duration than a slot.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and a user equipment (UE) 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to $3^{rd}$ Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a scheduling entity 108 may broadcast downlink traffic 112 to one or more scheduled entities 106. Broadly, the scheduling entity 108 is a node or device responsible for scheduling traffic in a wireless communication network, including the downlink traffic 112 and, in some examples, uplink traffic 116 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

In general, base stations 108 may include a backhaul interface for communication with a backhaul portion 120 of the wireless communication system. The backhaul 120 may provide a wired and wireless link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
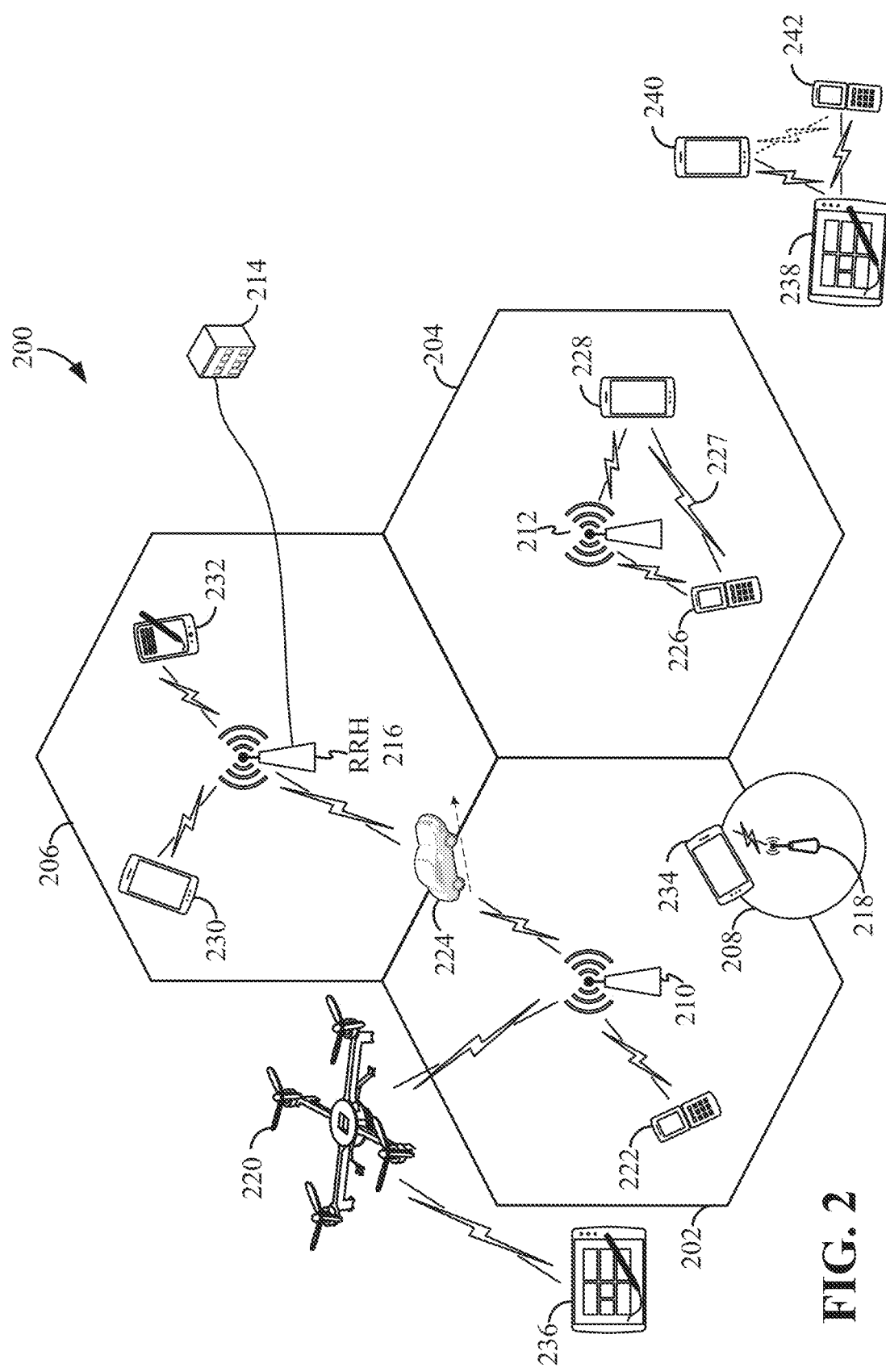
FIG. 2 is a conceptual illustration of an example of a radio access network.

FIG. 2 is a block diagram conceptually illustrating an example of a radio access network (RAN) 200 according to some aspects of the disclosure. By way of example and without limitation, a schematic illustration of a RAN 200 is provided. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 126 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station/scheduling entity 108 described above and illustrated in FIG. 1.

FIG. 2 further includes a quadcopter or drone 220, which may be configured to function as a base station. That is, in some examples, a cell may not necessarily be stationary, and the geographic area of the cell may move according to the location of a mobile base station such as the quadcopter 220.

Within the RAN 200, the cells may include UEs that may be in communication with one or more sectors of each cell. Further, each base station 210, 212, 214, 218, and 220 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. In some examples, the UEs 222, 224, 226, 228, 230, 232, 234, 236, 238, 240, and/or 242 may be the same as the UE/scheduled entity 106 described above and illustrated in FIG. 1.

In some examples, a mobile network node (e.g., quadcopter 220) may be configured to function as a UE. For example, the quadcopter 220 may operate within cell 202 by communicating with base station 210.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the scheduling entity 238. Thus, in a wireless communication system with scheduled access to time-frequency resources and having a cellular configuration, a P2P configuration, or a mesh configuration, a scheduling entity and one or more scheduled entities may communicate utilizing the scheduled resources.

In the radio access network 200, the ability for a UE to communicate while moving, independent of its location, is referred to as mobility. The various physical channels between the UE and the radio access network are generally set up, maintained, and released under the control of an access and mobility management function (AMF, not illustrated, part of the core network 102 in FIG. 1), which may include a security context management function (SCMF) that manages the security context for both the control plane and the user plane functionality, and a security anchor function (SEAF) that performs authentication.

In various aspects of the disclosure, a radio access network 200 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 (illustrated as a vehicle, although any suitable form of UE may be used) may move from the geographic area corresponding to its serving cell 202 to the geographic area corresponding to a neighbor cell 206. When the signal strength or quality from the neighbor cell 206 exceeds that of its serving cell 202 for a given amount of time, the UE 224 may transmit a reporting message to its serving base station 210 indicating this condition. In response, the UE 224 may receive a handover command, and the UE may undergo a handover to the cell 206.

In a network configured for UL-based mobility, UL reference signals from each UE may be utilized by the network to select a serving cell for each UE. In some examples, the base stations 210, 212, and 214/216 may broadcast unified synchronization signals (e.g., unified Primary Synchronization Signals (PSSs), unified Secondary Synchronization Signals (SSSs) and unified Physical Broadcast Channels (PBCH)). The UEs 222, 224, 226, 228, 230, and 232 may receive the unified synchronization signals, derive the carrier frequency and slot timing from the synchronization signals, and in response to deriving timing, transmit an uplink pilot or reference signal. The uplink pilot signal transmitted by a UE (e.g., UE 224) may be concurrently received by two or more cells (e.g., base stations 210 and 214/216) within the radio access network 200. Each of the cells may measure a strength of the pilot signal, and the radio access network (e.g., one or more of the base stations 210 and 214/216 and/or a central node within the core network) may determine a serving cell for the UE 224. As the UE 224 moves through the radio access network 200, the network may continue to monitor the uplink pilot signal transmitted by the UE 224. When the signal strength or quality of the pilot signal measured by a neighboring cell exceeds that of the signal strength or quality measured by the serving cell, the network 200 may handover the UE 224 from the serving cell to the neighboring cell, with or without informing the UE 224.

Although the synchronization signal transmitted by the base stations 210, 212, and 214/216 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access. The use of unlicensed and/or shared spectrum may increase interference in a network, and the interference may be more bursty.

In order for transmissions over the radio access network 200 to obtain a low block error rate (BLER) while still achieving very high data rates, channel coding may be used. That is, wireless communication may generally utilize a suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for any bit errors that may occur due to the noise.

In early 5G NR specifications, user data is coded using quasi-cyclic low-density parity check (LDPC) with two different base graphs: one base graph is used for large code blocks and/or high code rates, while the other base graph is used otherwise. Control information and the physical broadcast channel (PBCH) are coded using Polar coding, based on nested sequences. For these channels, puncturing, shortening, and repetition are used for rate matching.

However, those of ordinary skill in the art will understand that aspects of the present disclosure may be implemented utilizing any suitable channel code. Various implementations of scheduling entities 108 and scheduled entities 106 may include suitable hardware and capabilities (e.g., an encoder, a decoder, and/or a CODEC) to utilize one or more of these channel codes for wireless communication.

The air interface in the radio access network 200 may utilize one or more multiplexing and multiple access algorithms to enable simultaneous communication of the various devices. For example, 5G NR specifications provide multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Figure 3:
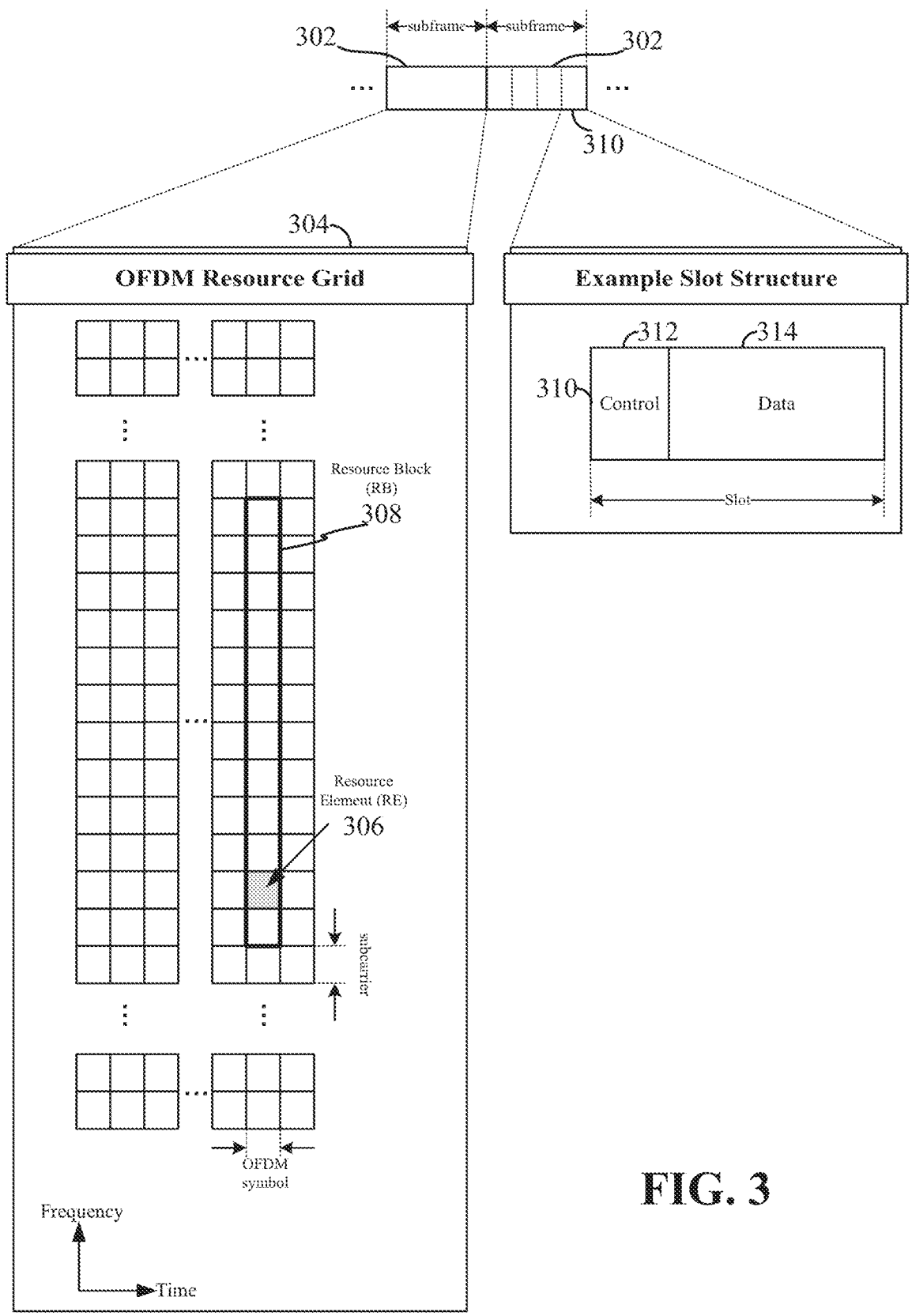
FIG. 3 is a schematic illustration of an organization of wireless resources in an air interface utilizing orthogonal frequency divisional multiplexing (OFDM).

FIG. 3 is a diagram illustrating an OFDM waveform according to some aspects of the disclosure. Various aspects of the present disclosure will be described with reference to the OFDM waveform, schematically illustrated in FIG. 3. It should be understood by those of ordinary skill in the art that the various aspects of the present disclosure may be applied to a DFT-s-OFDMA waveform in substantially the same way as described herein below. That is, while some examples of the present disclosure may focus on an OFDM link for clarity, it should be understood that the same principles may be applied as well to DFT-s-OFDMA waveforms.

Within the present disclosure, a frame refers to a predetermined duration (e.g., 10 ms) for wireless transmissions, with each frame consisting of, for example, 10 subframes of 1 ms each. On a given carrier, there may be one set of frames in the UL, and another set of frames in the DL. Referring now to FIG. 3, an expanded view of an exemplary DL subframe 302 is illustrated, showing an OFDM resource grid 304. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers or tones.

The resource grid 304 may be used to schematically represent time-frequency resources for a given antenna port. That is, in a MIMO implementation with multiple antenna ports available, a corresponding multiple number of resource grids 304 may be available for communication. The resource grid 304 is divided into multiple resource elements (REs) 306. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 308, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain. Within the present disclosure, it is assumed that a single RB such as the RB 308 entirely corresponds to a single direction of communication (either transmission or reception for a given device).

A UE generally utilizes only a subset of the resource grid 304. An RB may be the smallest unit of resources that can be allocated to a UE. Thus, the more RBs scheduled for a UE, and the higher the modulation scheme chosen for the air interface, the higher the data rate for the UE.

In this illustration, the RB 308 is shown as occupying less than the entire bandwidth of the subframe 302, with some subcarriers illustrated above and below the RB 308. In a given implementation, the subframe 302 may have a bandwidth corresponding to any number of one or more RBs 308. Further, in this illustration, the RB 308 is shown as occupying less than the entire duration of the subframe 302, although this is merely one possible example.

Each 1 ms subframe 302 may consist of one or multiple adjacent slots. In the example shown in FIG. 3, one subframe 302 includes four slots 310, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., one or two OFDM symbols). These mini-slots may in some cases be transmitted occupying resources scheduled for ongoing slot transmissions for the same or for different UEs.

An expanded view of one of the slots 310 illustrates the slot 310 including a control region 312 and a data region 314. In general, the control region 312 may carry control channels (e.g., PDCCH), and the data region 314 may carry data channels (e.g., PDSCH or PUSCH). Of course, a slot may contain all DL, all UL, or at least one DL portion and at least one UL portion. The simple structure illustrated in FIG. 3 is merely exemplary in nature, and different slot structures may be utilized, and may include one or more of each of the control region(s) and data region(s).

Although not illustrated in FIG. 3, the various REs 306 within a RB 308 may be scheduled to carry one or more physical channels, including control channels, shared channels, data channels, etc. Other REs 306 within the RB 308 may also carry pilots or reference signals, including but not limited to a demodulation reference signal (DMRS) a control reference signal (CRS), or a sounding reference signal (SRS). These pilots or reference signals may provide for a receiving device to perform channel estimation of the corresponding channel, which may enable coherent demodulation/detection of the control and/or data channels within the RB 308.

In a DL transmission, the transmitting device (e.g., the scheduling entity 108) may allocate one or more REs 306 (e.g., within a control region 312) to carry DL control information 114 including one or more DL control channels, such as a PBCH; a PSS; a SSS; a physical control format indicator channel (PCFICH); a physical hybrid automatic repeat request (HARQ) indicator channel (PHICH); and/or a physical downlink control channel (PDCCH), etc., to one or more scheduled entities 106. The PCFICH provides information to assist a receiving device in receiving and decoding the PDCCH. The PDCCH carries downlink control information (DCI) including but not limited to power control commands, scheduling information, a grant, and/or an assignment of REs for DL and UL transmissions. The PHICH carries HARQ feedback transmissions such as an acknowledgment (ACK) or negative acknowledgment (NACK). HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission confirmed, an ACK may be transmitted, whereas if not confirmed, a NACK may be transmitted. In response to a NACK, the transmitting device may send a HARQ retransmission, which may implement chase combining, incremental redundancy, etc.

In an UL transmission, the transmitting device (e.g., the scheduled entity 106) may utilize one or more REs 306 to carry UL control information 118 including one or more UL control channels, such as a physical uplink control channel (PUCCH), to the scheduling entity 108. UL control information may include a variety of packet types and categories, including pilots, reference signals, and information configured to enable or assist in decoding uplink data transmissions. In some examples, the control information 118 may include a scheduling request (SR), i.e., request for the scheduling entity 108 to schedule uplink transmissions. Here, in response to the SR transmitted on the control channel 118, the scheduling entity 108 may transmit downlink control information 114 that may schedule resources for uplink packet transmissions. UL control information may also include HARQ feedback, channel state feedback (CSF), or any other suitable UL control information.

In addition to control information, one or more REs 306 (e.g., within the data region 314) may be allocated for user data or traffic data. Such traffic may be carried on one or more traffic channels, such as, for a DL transmission, a physical downlink shared channel (PDSCH); or for an UL transmission, a physical uplink shared channel (PUSCH). In some examples, one or more REs 306 within the data region 314 may be configured to carry system information blocks (SIBs), carrying information that may enable access to a given cell.

The channels or carriers described above and illustrated in FIGS. 1 and 3 are not necessarily all the channels or carriers that may be utilized between a scheduling entity 108 and scheduled entities 106, and those of ordinary skill in the art will recognize that other channels or carriers may be utilized in addition to those illustrated, such as other traffic, control, and feedback channels.

These physical channels described above are generally multiplexed and mapped to transport channels for handling at the medium access control (MAC) layer. Transport channels carry blocks of information called transport blocks (TB). A TB may carry one or more code block groups (CBGs). The transport block size (TBS), which may correspond to a number of bits of information, may be a controlled parameter, based on the modulation and coding scheme (MCS) and the number of RBs in a given transmission.

Figure 4:
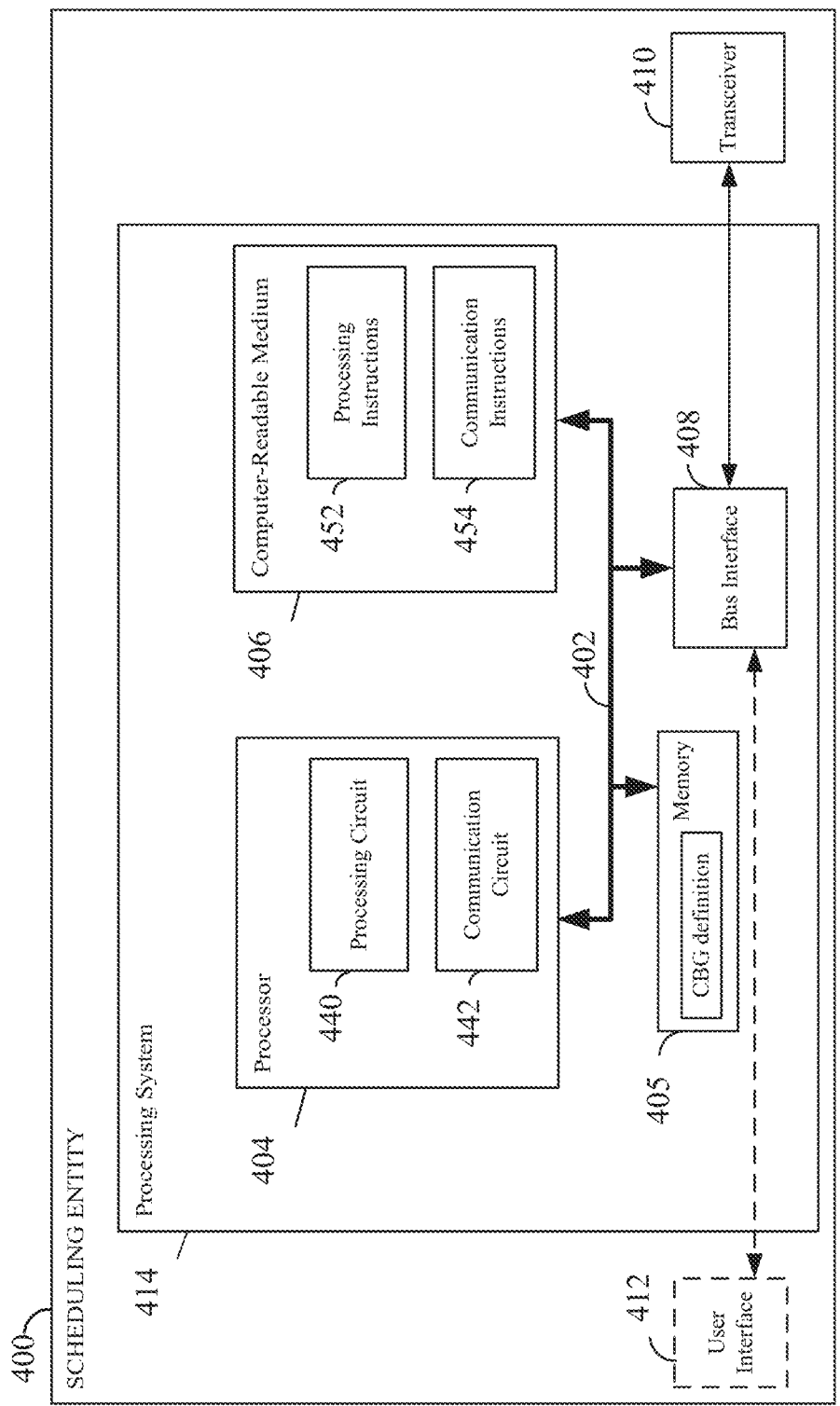
FIG. 4 is a block diagram illustrating an example of a hardware implementation for a scheduling entity employing a processing system according to some aspects of the disclosure.

FIG. 4 is a block diagram illustrating an example of a hardware implementation for a scheduling entity 400 employing a processing system 414. For example, the scheduling entity 400 may be a user equipment (UE) as illustrated in any one or more of FIGS. 1, 2, and/or 7. In another example, the scheduling entity 400 may be a base station as illustrated in any one or more of FIGS. 1, 2, and/or 7.

The scheduling entity 400 may be implemented with a processing system 414 that includes one or more processors 404. Examples of processors 404 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 400 may be configured to perform any one or more of the functions described herein. That is, the processor 404, as utilized in a scheduling entity 400, may be used to implement any one or more of the processes and procedures described below and illustrated in FIGS. 6-12.

In this example, the processing system 414 may be implemented with a bus architecture, represented generally by the bus 402. The bus 402 may include any number of interconnecting buses and bridges depending on the specific application of the processing system 414 and the overall design constraints. The bus 402 communicatively couples together various circuits including one or more processors (represented generally by the processor 404), a memory 405, and computer-readable media (represented generally by the computer-readable medium 406). The bus 402 may also link various other circuits such as timing sources, peripherals, voltage regulators, and power management circuits, which are well known in the art, and therefore, will not be described any further. A bus interface 408 provides an interface between the bus 402 and a transceiver 410. The transceiver 410 provides a communication interface or means for communicating with various other apparatus over a transmission medium. Depending upon the nature of the apparatus, a user interface 412 (e.g., keypad, display, speaker, microphone, joystick) may also be provided. Of course, such a user interface 412 is optional, and may be omitted in some examples, such as a base station.

In some aspects of the disclosure, the processor 404 may include circuitry (e.g., processing circuit 440 and communication circuit 442) configured to implement one or more of the functions described below in relation to FIGS. 6-12.

The processor 404 is responsible for managing the bus 402 and general processing, including the execution of software stored on the computer-readable medium 406. The software, when executed by the processor 404, causes the processing system 414 to perform the various functions described below for any particular apparatus. The computer-readable medium 406 and the memory 405 may also be used for storing data that is manipulated by the processor 404 when executing software.

One or more processors 404 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 406. The computer-readable medium 406 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 406 may reside in the processing system 414, external to the processing system 414, or distributed across multiple entities including the processing system 414. The computer-readable medium 406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In one or more examples, the computer-readable storage medium 406 may include software (e.g., processing instructions 452 and communication instructions 454 configured to implement one or more of the functions and processes described in relation to FIGS. 6-12.

Figure 5:
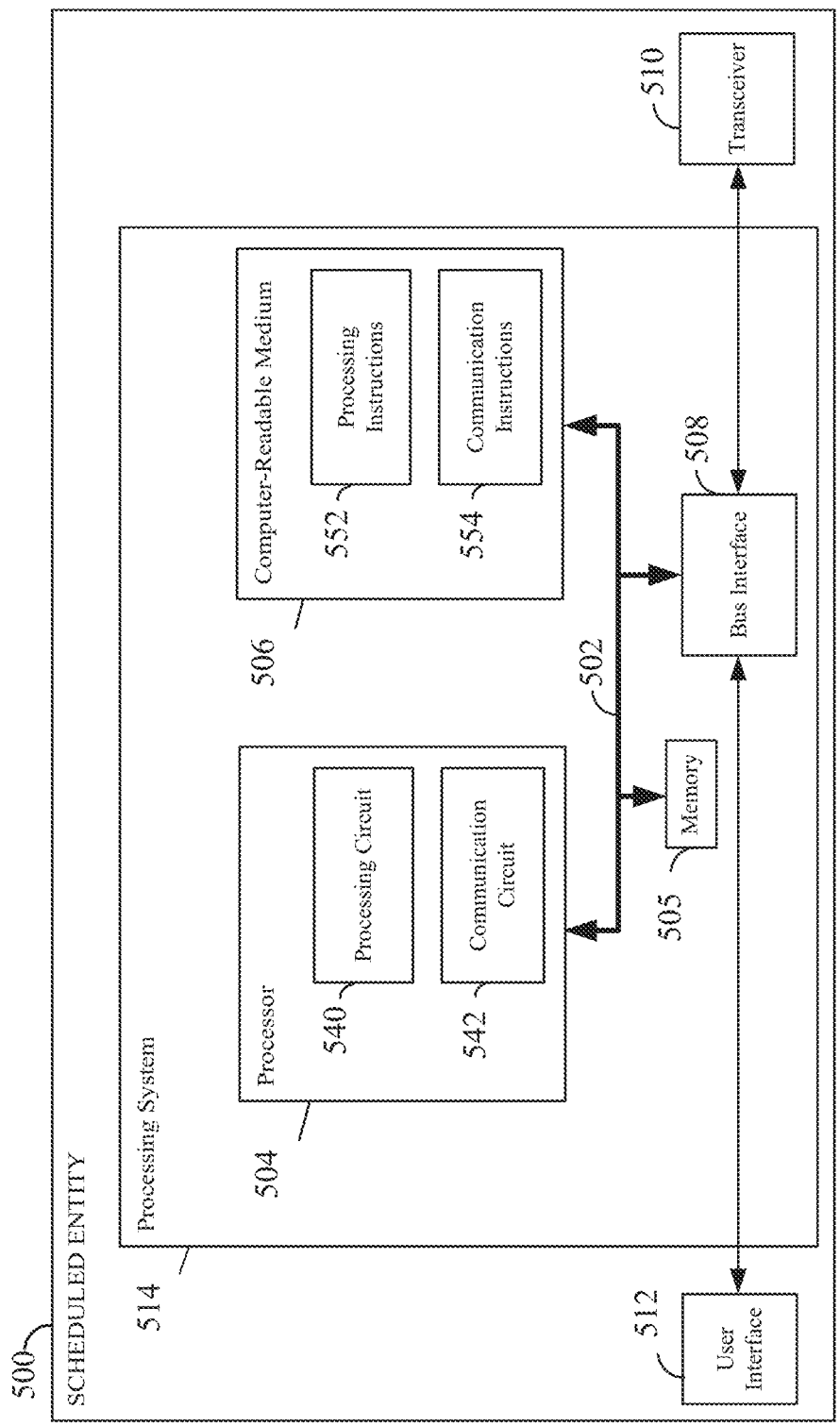
FIG. 5 is a block diagram illustrating an example of a hardware implementation for a scheduled entity employing a processing system according to some aspects of the disclosure.

FIG. 5 is a conceptual diagram illustrating an example of a hardware implementation for an exemplary scheduled entity 500 employing a processing system 514. In accordance with various aspects of the disclosure, an element, or any portion of an element, or any combination of elements may be implemented with a processing system 514 that includes one or more processors 504. For example, the scheduled entity 500 may be a user equipment (UE) as illustrated in any one or more of FIGS. 1, 2, and/or 7.

The processing system 514 may be substantially the same as the processing system 514 illustrated in FIG. 5, including a bus interface 508, a bus 502, memory 505, a processor 504, and a computer-readable medium 506. Furthermore, the scheduled entity 500 may include a user interface 512 and a transceiver 510 substantially similar to those described above in FIG. 4. That is, the processor 504, as utilized in a scheduled entity 500, may be used to implement any one or more of the processes described and illustrated in FIGS. 6-12.

In some aspects of the disclosure, the processor 504 may include circuitry (e.g., processing circuit 540 and communication circuit 542) configured to implement one or more of the functions described in relation to FIGS. 6-12. In one or more examples, the computer-readable storage medium 506 may include software (e.g., processing instructions 552 and communication instructions 554 configured to implement one or more of the functions described in relation to FIGS. 6-12.

Figure 6:
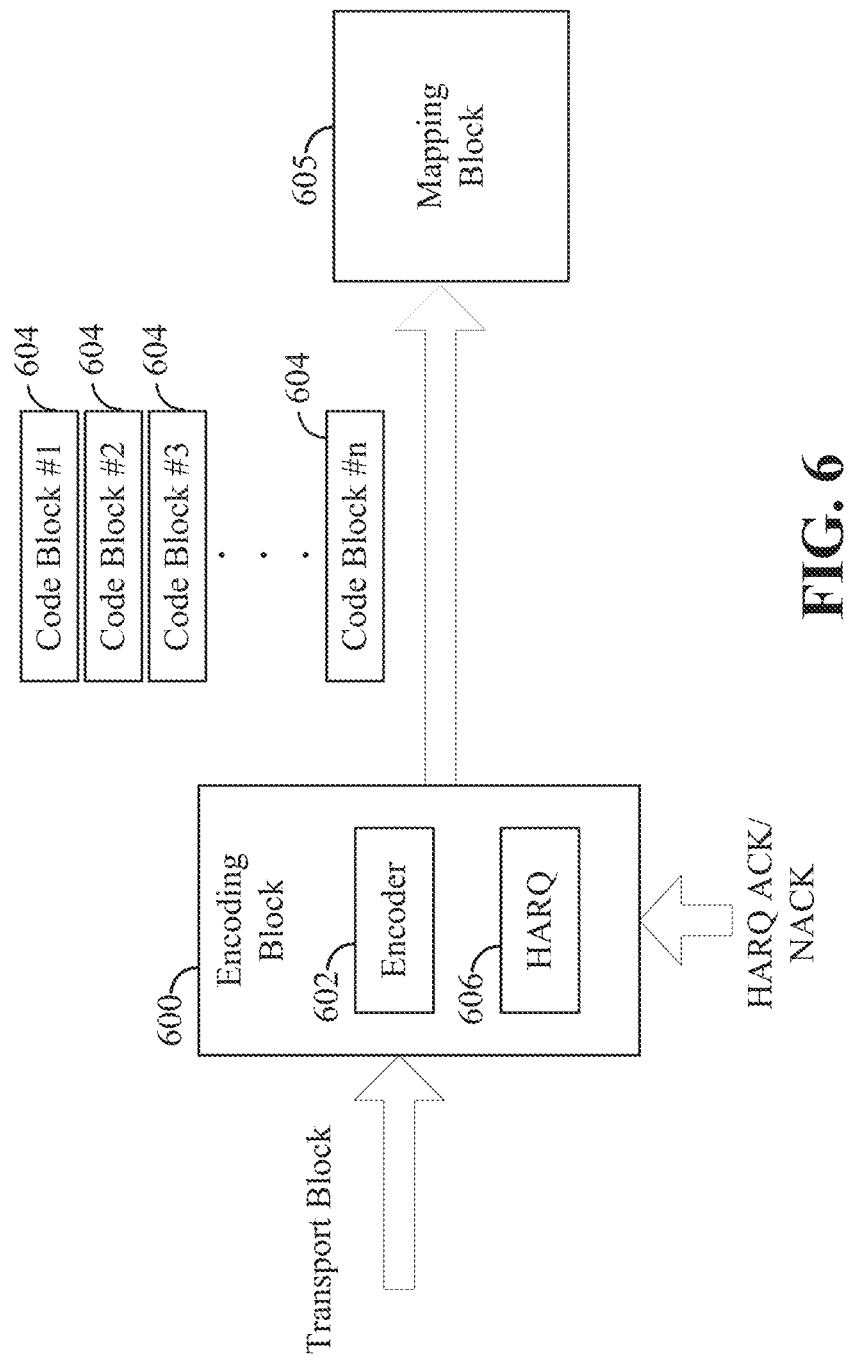
FIG. 6 is a diagram illustrating a code block group encoding process according to some aspects of the disclosure.

FIG. 6 is a diagram illustrating a code block group encoding process according to some aspects of the disclosure. An encoding block 600 receives as input a transport block of data for transmission. In some examples, the encoding block 600 may be implemented using the processing circuit 440/540 of FIGS. 4 and 5. The encoding block 600 includes an encoder 602 configured to encode the transport block into one or more code blocks (CBs) for a transport block. In this example, n code blocks 604 are illustrated in FIG. 6. The code blocks 604 may be held in a memory (e.g., memory 405/505 of FIGS. 4 and 5) for later processing and transmission. The encoding block 600 may include a HARQ entity 606 configured to receive HARQ feedback (e.g., ACK or NACK) corresponding to the transmitted data, and may determine to retransmit the code blocks based on the HARQ feedback. For example, upon receiving a NACK for a code block group (CBG) including one or more code blocks, the encoding block 600 outputs the code blocks included in that CBG for retransmission. Upon receiving ACKs corresponding to all the CBGs, the encoding block 600 encodes the next transport block for transmission. A mapping block 605 may map the CBs 604 to a number of time domain symbols (e.g., PDSCH OFDM symbols) for transmission. In some examples, the mapping block 605 may be implemented using the processing circuit 440/540 of FIGS. 4 and 5.

Figure 7:
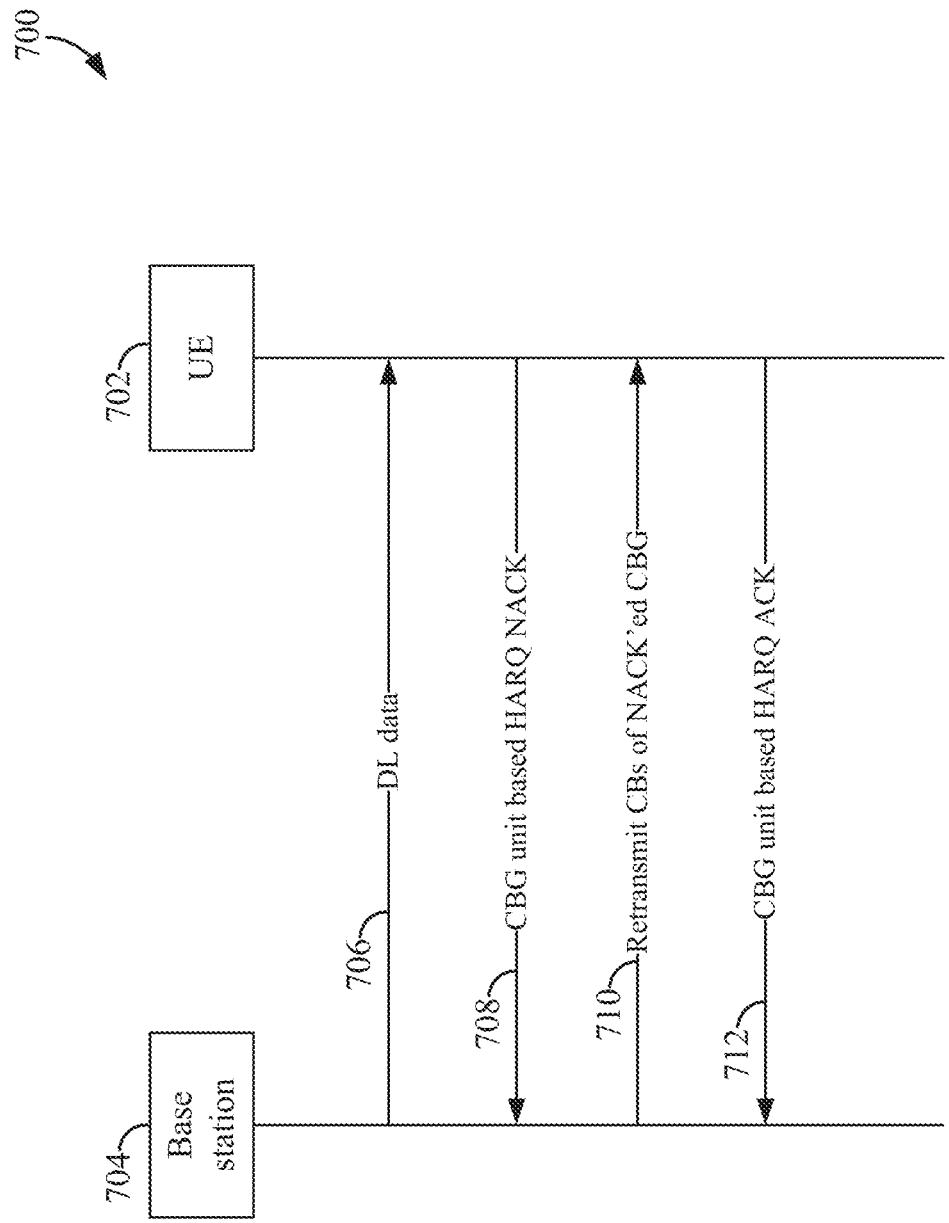
FIG. 7 is a diagram illustrating a communication process between a user equipment and a base station according to some aspects of the disclosure.

FIG. 7 is a diagram illustrating a communication process 700 between a UE 702 and a base station 704 according to some aspects of the disclosure. The UE 702 may be any of the UEs described in relation to FIGS. 1, 2, and/or 5. In some examples, the UE 702 may be any suitable means for carrying out the described functions. The base station 704 may be any of the base stations described in relation to FIGS. 1, 2, and/or 4. In some examples, the base station 704 may be any suitable means for carrying out the described functions.

The base station 704 may transmit downlink (DL) data to the UE 702. The DL data may include code blocks of a transport block (TB). The code blocks may be grouped into a plurality of CBGs for transmission in a slot according to a code block group (CBG) definition. A CBG definition are rules for grouping code blocks of a TB into one or more CBGs. The base station 704 may store one or more predetermined CBG definitions, for example in memory 405, and may inform the UE which CBG definition to use when the UE registers with the base station. After receiving the DL transmission, the UE 702 may transmit a CBG unit based HARQ feedback to the base station 704. In one aspect of the disclosure, if the UE does not successfully receive any CB, the UE 702 transmits a NACK 708 to the base station 704 indicating the CBG that includes the CB not successfully received. For example, the UE may transmit uplink control information (UCI) including the HARQ NACK 708 that identifies the CBG. In response to the NACK, the base station 704 may retransmit the CBs 710 of the NACK'ed CBG. In some examples, the UE may send multiple NACKs when the UE cannot successfully receive CBs included in multiple CBGs. If the UE 702 successfully receives the retransmitted CBs, the UE transmits an ACK to the base station 704.

In some aspects of the disclosure, the above-described communication process 700 may be adapted for an uplink (UL) data transmission between the UE 702 and base station 704. In that case, the base station 704 may transmit a CBG unit based HARQ feedback for UL data transmission from the UE.

Figure 8:
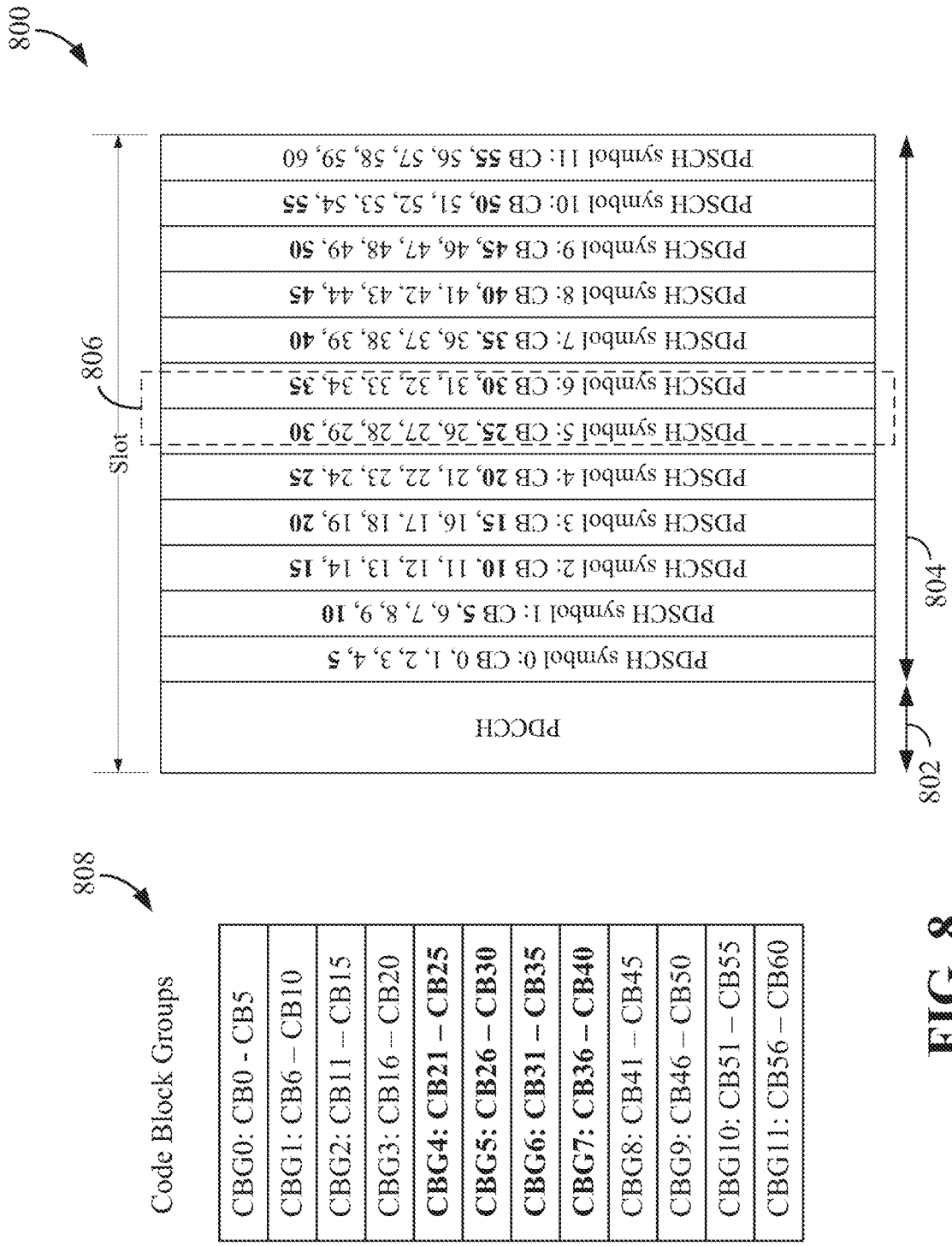
FIG. 8 is a diagram illustrating a code block group definition for wireless communication according to some aspects of the disclosure.

FIG. 8 is a diagram illustrating a code block group (CBG) definition for wireless communication according to some aspects of the disclosure. In some examples, a DL slot 800 may be utilized for DL communication between a scheduling entity 202 (e.g., a base station) and one or more scheduled entities 204 (e.g., UE), or between any devices illustrated in FIGS. 1, 2, 4, 5, 6, and/or 7. The DL slot may be the same as the DL slot 310 (see FIG. 3) and includes a control portion 802 and a data portion 804. The control portion 802 may carry scheduling assignments and other control information, for example, PDCCH that provides various control information such as download control information (DCI). In some examples, DCI may include resource allocation information, power control command, channel status information (CSI), channel quality indicator (CQI), UL grants, etc.

The data portion 804 may carry DL user or payload data for one or more scheduled entities. The DL data may correspond to one or more transport blocks that are mapped to a number of time domain symbols (e.g., 12 PDSCH OFDM symbols shown in FIG. 8). In some examples, a slot may carry one or more TBs. In 5G NR, a TB may include a predetermined number of code blocks (CBs) (e.g., 61 CBs shown in FIG. 8) that are mapped to the transmitted PDSCH symbols. However, the CBs, and their respective CBGs, may not align with the OFDM symbol boundary. For example, CB0, CB1, CB2, CB3, CB4, and a first portion of CB5 are mapped to symbol 0. Similarly, a second portion of CB5, CB6, CB7, CB8, CB9, and a first portion of CB10 are mapped to symbol 1. Likewise, the last symbol (e.g., PDSCH symbol 11) carries a portion of CB55, CB56, CB57, CB58, CB59, and CB60. That is, some of the CBs (e.g., CB5, CB10, CB15, CB20, CB25, CB30, CB35, CB40, CB45, CB50, and CB55) are mapped across two symbols. In that case, a CB rides across symbol boundary.

In some cases, a bursty interference pattern may interfere with the transmission of some symbols of the slot 800. A bursty interference pattern has a short duration as compared to the slot. For example, a bursty interference pattern may be caused by one or more mini-slots that overlap one or more symbols of the slot 800. FIG. 8 illustrates an exemplary bursty interference pattern 806 that overlaps symbols 5 and 6. Therefore, CB25 through CB35, which are mapped to symbols 5 and 6, may not be successfully received by the scheduled entity or UE. Although the interference pattern 806 may affect only a portion of the symbol in the time domain, all CBs of the symbol may be equally affected because of frequency domain interleaving of the CBs within the symbol. In this case, the scheduled entity may transmit a HARQ NACK for the CBGs containing CB25 through CB35.

In one aspect of the disclosure, the CBs may be grouped into twelve CBGs (e.g., CBG0, CBG1, CBG2 CBG11) according to a CBG definition 808. In 5G NR, HARQ retransmission may be performed in CBG unit, instead of being based on the entire TB. That is, the receiving device may transmit HARQ feedback indicating a NACK for each CBG that includes one or more CBs that are not successfully decoded or received. In response, the transmitting device may retransmit only the CBG(s) that include one or more CBs that have not been successfully received or decoded. In this CBG definition 808, the CBGs do not overlap in terms of CBs. That is, the CBGs contain different and exclusive sets of CBs. In the example shown in FIG. 8, the interference pattern 806 affects CB25 through CB35, which are carried in symbol 4 through symbol 7. CB25 is included in CBG4 that is carried across symbols 4 and 5. CB35 is included in CBG6 that is carried across symbols 6 and 7. In order to retransmit CB25 through CB35, the scheduling entity retransmits CBG4-CBG7 using a CBG based HARQ process that performs retransmission based on CBG units instead of TB units. Even though the interference pattern 806 does not affect CB21-CB24 and CB360-CB40, these CBs are retransmitted because CB25 and CB35 are included in CBG4 and CBG7, respectively. In this example, a total of 21 CBs are retransmitted.

Figure 9:
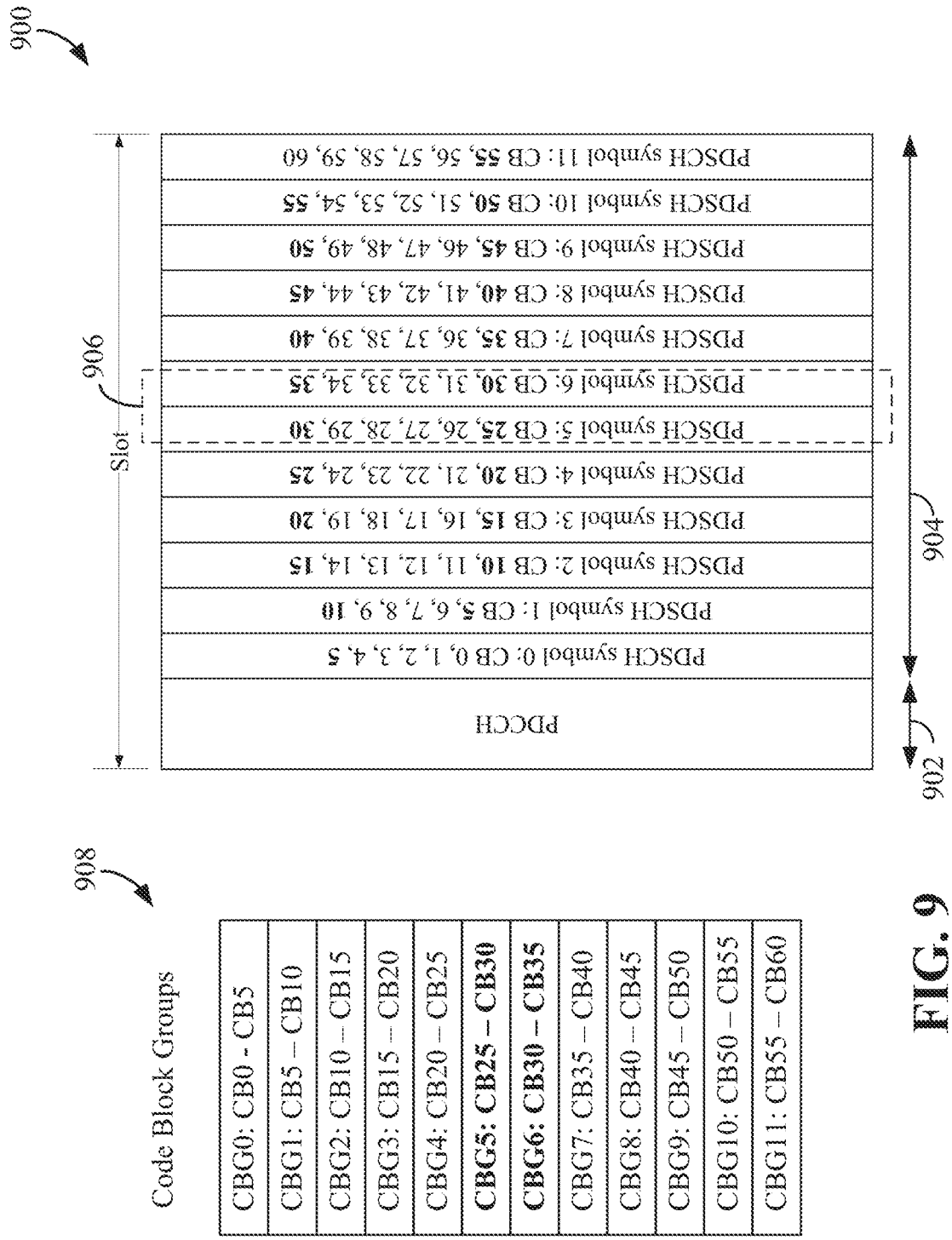
FIG. 9 is a diagram illustrating an overlapping code block group definition for wireless communication according to some aspects of the disclosure.
Figure 10:
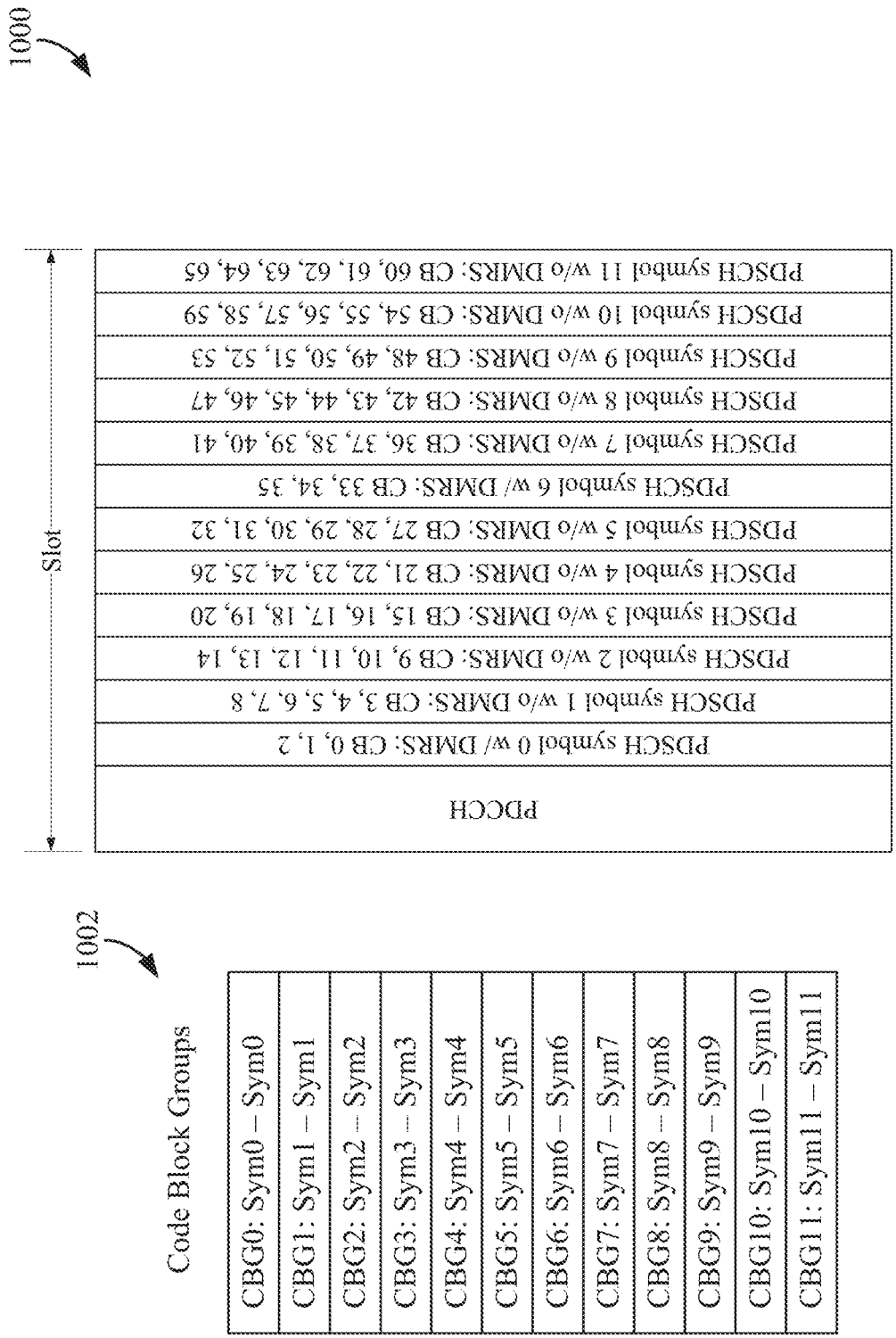
FIG. 10 is a diagram illustrating a slot with CBs grouped based on time-frequency domain structure according to one aspect of the disclosure.

In some aspects of the disclosure, the CBGs may be defined in such a way to improve the efficiency or reduce overhead of a CBG-based HARQ retransmission process. FIGS. 9 and 10 illustrate some exemplary CBG definitions that can reduce the HARQ retransmission of CBs that have already been correctly received.

FIG. 9 is a diagram illustrating an overlapping code block group (CBG) definition for wireless communication according to some aspects of the disclosure. In some examples, a slot 900 may be utilized for DL communication between a scheduling entity 202 (e.g., a base station) and one or more scheduled entities 204 (e.g., UE), or between any devices illustrated in FIGS. 1, 2, and/or 7. The slot 900 includes a control portion 902 and a data portion 904. The slot 900 is similar to the slot 800 of FIG. 8, and redundant description may be omitted for brevity.

The slot 900 may contain a plurality of symbols in its data portion 904 that may be affected by a bursty interference pattern 906 that is significantly shorter than the slot. In this particular example, symbol 5 and symbol 6 are affected by the bursty interference pattern. Thus, the scheduling entity may need to retransmit the CBs corresponding to these symbols using a CBG based HARQ process. The efficiency of the retransmission may be improved by reducing the number of CBGs retransmitted in a HARQ retransmission.

In one aspect of the disclosure, the CBGs may be defined in an overlapping fashion in terms of CBs. An exemplary overlapping CBG definition 908 is shown in FIG. 9. For example, CBG0 contains CB0 through CB5, and CBG1 contains CB5 through CB10. Unlike the CBG definition 808 of FIG. 8, CBs (e.g., CB5, CB10, CB15, CB20, CB25, CB30, CB35, CB40, CB 45, CB50, CB55, and CB60) at the boundary of neighboring CBGs may be included in more than one CBG. That is, some CBs may be repeated in adjacent CBGs according to the CBG definition 908. In this example, the interference pattern 906 affects CB25-CB35 that are included in CBG4 through CBG7. Because of the overlapping CBGs, the scheduling entity need to retransmit only CBG 5 and CBG 6 using a CBG unit based HARQ process in order to retransmit CB25-CB35. Therefore, eleven CBs are retransmitted that is less than the twenty-one CBs retransmitted in the example described in relation to FIG. 8. The overlapping CBG definition 908 can result in a significant reduction of the number of CBs retransmitted under similar bursty interference patterns. In some examples, adjacent CBGs may overlap by one or more CBs. In some examples, the number of CBs included in each CBG may vary. In some examples, the number of CBs included in a CBG may be fewer or more than 6 CBs. In some examples, a CBG may overlap with one or more adjacent CBGs.

In some aspects of the disclosure, the CBGs may be generally uniformly in size. That is, each CBG has roughly the same number of CBs. In one example, twenty-five CBs can be grouped into ten CBGs, in which five CBGs may have two CBs each and another five CBGs may have three CBs each. However, in some cases, the CBGs may not align with potential interference structure or pattern. For example, a slot may have ten OFDM symbols for PDSCH data transmission, and ten CBGs are specified for the slot. If each OFDM symbol has about the same number of resource elements (REs) for carrying data, the number of CBs in each OFDM symbol is approximately the same. In this case, each CBG may have the same number of CBs. In some examples, some OFDM symbols of a slot may carry other signals such as a demodulation reference signal (DMRS) or other control signals, and therefore some OFDM symbols can carry fewer number of CBs than others. In this case, grouping equal or substantially equal number of CBs into each CBG may reduce retransmission efficiency because the CBGs do not align with the symbol boundaries.

In some aspects of the disclosure, a scheduling entity (e.g., a base station or gNB) can specify a CBG definition in the time-frequency domain (e.g., defining a CBG based on a set of time-frequency REs within a slot). In some examples, the time-frequency domain CBG structure can be reduced or simplified to time domain only (e.g., time domain symbols). In one aspect of the disclosure, a scheduling entity can specify the starting symbol and ending symbol for each CBG. A CB riding on the boundary of multiple time-frequency CBG structures (e.g., on a symbol boundary) may belong to both CBGs (e.g., overlapping CBG definition).

In some aspects of the disclosure, for each time-frequency CBG structure specified (e.g., a resource block, an OFDM symbol, or some combination of the above), a scheduling entity (e.g., a base station) can indicate how many CBGs are defined, and the CBs in the time-frequency CBG structure can be approximately uniformly split into that many CBGs.

In some aspects of the disclosure, the time-frequency CBG structure may be slot format dependent. For example, the scheduling entity can specify different time-frequency CBG structures for different slot formats that may be different in terms of their respective numbers of data OFDM symbols, DMRS pattern, PDCCH reuse for user data, etc. In one particular example, unused PDCCH resources may be reused for PDSCH data, but the number of REs in the PDCCH region may change significantly. When PDSCH data are carried in unused or repurposed PDCCH resources, the scheduling entity can use a CBG specifically reserved or defined for all CBs in the PDCCH region.

FIG. 10 is a diagram illustrating a code block group (CBG) definition based on a time-frequency CBG structure for wireless communication according to some aspects of the disclosure. In this example, a slot 1000 may be assigned to carry sixty-six CBs (CB0-CB65) distributed in twelve OFDM symbols (Symbol 0-Symbol 11). In this example, symbol 0 and symbol 6 have DMRS. Therefore, these symbols have less resources to transmit CBs, and for example, can carry half the number of CBs that can be held in other symbols without DMRS. A scheduling entity (e.g., a base station) can use a CBG definition 1002 that specifies a certain CBG to start at a first symbol (e.g., symbol i) and end at a second symbol (e.g., symbol j). In one example, the scheduling entity may define twelve CBGs based on the number of time domain symbols in the slot. In this case, CBG0 is defined to start from symbol 0 and end at symbol 0. CBG1 is defined to start from symbol 1 and end at symbol 1. The number of CBs included in each CBG depends on the available resources. For example, symbol 0 includes a DMRS in some of its REs, so less resources are available for carrying CBs. The other CBGs are defined in a similar fashion. In this example, each CBG is restricted to one symbol and does not cross OFDM symbol boundary.

In another example, the scheduling entity can define six CBGs, each covering two PDSCH symbols. For example, CBG0 may cover symbol 0 and symbol 1, CBG1 may cover symbol 2 and symbol 3, and so on. In general, each CBG is restricted to one or more symbols and will not cross OFDM symbol boundary. Using CBG definition based on a time-frequency CBG structure can avoid and/or reduce the retransmission of CBGs assigned to symbols that are not affected by a bursty interference.

The concepts of defining CBGs described above may be used in UL and/or DL transmissions in various examples including some or all of the described features.

Figure 11:
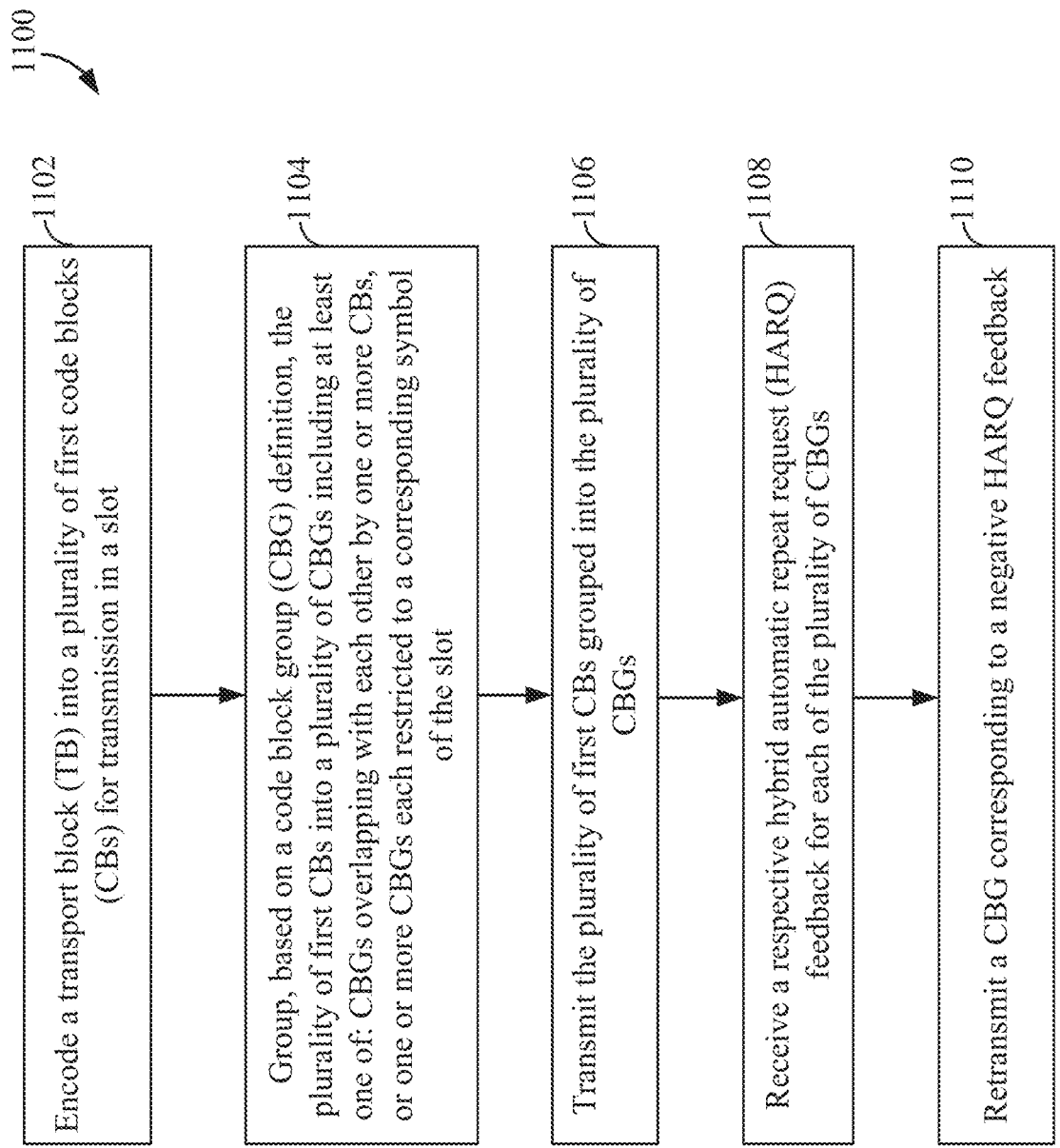
FIG. 11 is a flow chart illustrating an exemplary process for wireless communication at a scheduling entity utilizing overlapping code block groups according to some aspects of the disclosure.

FIG. 11 is a flow chart illustrating an exemplary process 1100 for wireless communication at a scheduling entity utilizing a CBG definition according to some aspects of the disclosure. As described below, some or all illustrated features may be omitted in a particular implementation within the scope of the present disclosure, and some illustrated features may not be required for implementation of all embodiments. In some examples, the process 1100 may be carried out by the scheduling entity 400 and/or scheduled entity 500 illustrated in FIGS. 4 and/or 5. In some examples, the process 1100 may be carried out by any suitable apparatus or means for carrying out the functions or algorithm described below.

At block 1102, a scheduling entity may encode a transport block (TB) into a plurality of first code blocks (CBs) for transmission in a slot. The scheduling entity may utilize the processing circuit 440 to divide a TB into a plurality of CBs and encode the CBs using a channel coding process, for example using the encoder 602. The scheduling entity may store a CBG definition or rules for grouping CBs in a memory 405 (e.g., FIG. 4).

At block 1104, the scheduling entity may utilize a processing circuit 440 to group the plurality of first CBs into a plurality of CBGs based on a CBG definition. The CBGs include CBGs overlapping with each other by one or more CBs, and/or one or more CBGs each restricted to a corresponding symbol of the slot. These CBGs are grouped in such a way to reduce a number of the CBGs from crossing symbol boundaries of the slot, and reduce retransmission of one or more of the CBGs due to a bursty interference pattern having a duration shorter than the slot. For example, the slot may be a slot for transmitting a PDCCH and PDSCH, and the bursty interference may be a mini-slot that overlaps and affects only some symbols of the slot. The CBG definition may be similar to the CBG definitions described above in relation to FIGS. 9 and 10.

In one aspect of the disclosure, the CBG definition includes a number of CBGs that overlaps with each other by one or more CBs. For example, the scheduling entity may provide or indicate the overlapping CBG definition in a configuration message destined to the scheduled entity. In one example, the scheduling entity may utilize a communication circuit 442 to send the configuration message as a radio resource configuration (RRC) message that indicates or includes a CBG definition that may be used in a CBG based HARQ process. In some examples, a number of predetermined CBG definitions may be stored at the scheduled entity (e.g., memory 505). In that case, the RRC message contains a value or index that indicates one of the predetermined CBG definitions. The CBG definition may include a number of CBGs, size(s) of the CBGs, and/or CBs contained in each CBG. In one example, the CBGs may be similar to the CBGs shown in FIGS. 9 and 10. In some aspects of the disclosure, the CBGs may have the same size or different sizes. That is, the CBGs may each contain the same number of CBs or a different number of CBs. In some examples, some CBGs may not overlap with each other, and some CBGs may overlap by one or more CBs.

In one aspect of the disclosure, the scheduling entity may utilize the processing circuit 440 to determine a CBG definition of the plurality of first CBs to correspond to a plurality of time-frequency CBG resources. In some example, the time-frequency CBG resources may be OFDM symbols of a slot. In that case, the CBG definition may group CBGs to align with the symbol boundaries of time domain symbols. The number of CBs included in each CBG may depend on the available resources (e.g., REs) of the corresponding symbol. For example, a symbol carrying reference signals (e.g., DMRS) has fewer resources for carrying CBs than a symbol carrying no reference signal.

In one aspect of the disclosure, a CBG definition includes a first CBG definition for a control portion (e.g., PDCCH) of a slot and a second CBG definition for a data portion (e.g., PDSCH) of the slot. The second CBG definition is different from the first CBG definition. In this case, unused resources of the control portion may be used to carry CBs of the data portion.

At block 1106, the scheduling entity may utilize a communication circuit 442 (see FIG. 4) to transmit data including the plurality of first CBs grouped into the plurality of CBGs to the scheduled entity. For example, the data may be carried in the PDSCH symbols of the data portion 904 shown in FIG. 9. In one example, the symbols may carry CB0 through CB60.

At block 1108, the scheduling may utilize the communication circuit 442 to receive a respective CBG based HARQ feedback for each CBG of the plurality of CBGs according to the CBG definition. For example, the HARQ feedback may be an ACK indicating that the corresponding CBG is received successfully or a NACK indicating that the corresponding CBG has at least one CB that is not received successfully. Some CBs may not be transmitted successfully due to bursty interference affecting some symbols.

At block 1110, the scheduling entity may utilize the communication circuit 442 to retransmit a CBG corresponding to a negative HARQ feedback (i.e., NACK). The CBG may include one or more CBs that are not successfully transmitted due to a bursty interference. Because the CBG definition is designed to avoid crossing symbol boundary, HARQ retransmission efficiency may be improved by reducing redundant retransmission of correctly received CBs as described in relation of FIGS. 9 and 10.

Figure 12:
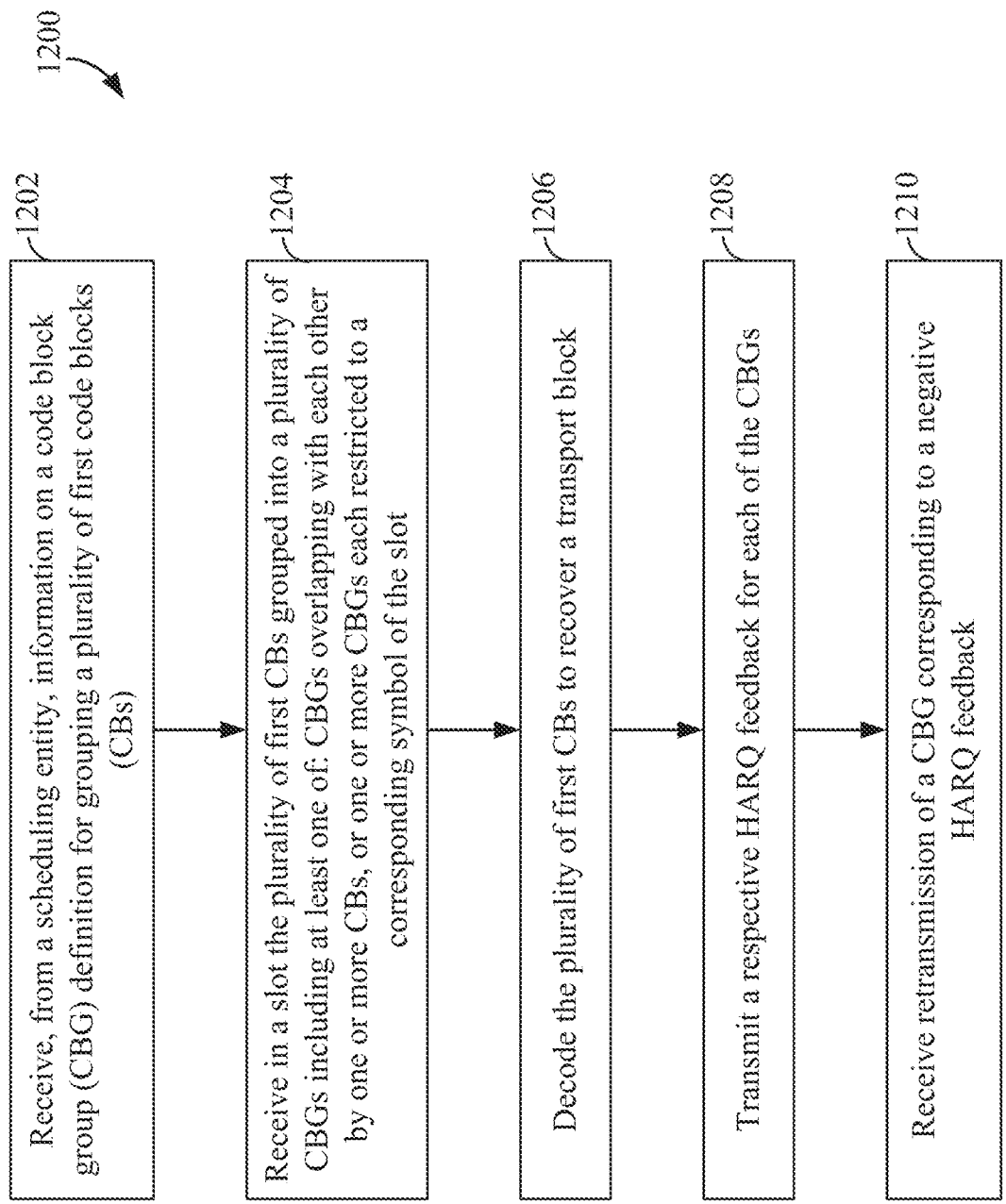
FIG. 12 is a flow chart illustrating an exemplary process for wireless communication at a scheduled entity utilizing overlapping code block groups according to some aspects of the disclosure.

FIG. 12 is a flow chart illustrating an exemplary process 1200 for wireless communication at a scheduled entity utilizing a CBG definition according to some aspects of the disclosure. As described below, some or all illustrated features may be omitted in a particular implementation within the scope of the present disclosure, and some illustrated features may not be required for implementation of all embodiments. In some examples, the process 1200 may be carried out by the scheduling entity 400 and/or scheduled entity 500 illustrated in FIGS. 4 and/or 5. In some examples, the process 1200 may be carried out by any suitable apparatus or means for carrying out the functions or algorithm described below.

At block 1202, a scheduled entity (e.g., UE) may utilize a communication circuit 542 (see FIG. 5) to receive from a scheduling entity information on a code block group (CBG) definition for grouping a plurality of first code blocks (CBs). The CBG definition is configured to reduce a number of CBGs from crossing symbol boundaries in a slot. That can reduce retransmission of one or more of the CBGs including correctly received CBs due to a bursty interference having a duration shorter than the slot.

In one aspect of the disclosure, the CBG definition includes a number of CBGs that overlaps with each other by one or more CBs. In one example, the overlapping CBGs may be similar to the CBGs shown in FIG. 9. In some examples, some CBGs may not overlap with each other, and some CBGs may overlap by one or more CBs. In another aspect of the disclosure, the CBG definition includes a number of CBGs similar to the CBGs shown in FIG. 10 that are each defined to align with symbol boundary such that a CBG does not cross a boundary between symbols.

In one example, the scheduled entity may receive the CBG definition in a configuration message from the scheduling entity. In one example, the configuration message may be an RRC message that indicates or includes a CBG definition that may be used in a CBG based HARQ retransmission process. In some examples, a number of predetermined CBG definitions may be stored at the scheduled entity (e.g., memory 505). In that case, the RRC message may include a value or index that indicates one of the predetermined CBG definitions. The CBG definition may include a number of CBGs, size(s) of the CBGs, and/or CBs contained in each CBG. In some aspects of the disclosure, the CBGs may have the same size or different sizes. That is, the CBGs may each contain the same number of CBs or different numbers of CBs.

At block 1204, the scheduled entity may utilize the communication circuit 542 to receive in a slot the plurality of first CBs grouped into a plurality of CBGs including at CBGs overlapping with each other by one or more CBs, and/or one or more CBGs each restricted to a corresponding symbol of the slot. In one example, the data may be carried in PDCCH and/or PDSCH symbols in the slot. In one example, PDSCH symbols may carry CB0 through CB60. At block 1206, the scheduled entity may utilize the processing circuit 540 to decode the CBs to recover a transport block.

At block 1208, the scheduled entity may utilize the communication circuit 542 to transmit a respective HARQ feedback for each of the CBGs. For example, the HARQ feedback may be an ACK indicating that all CBs included in a certain CBG is received successfully or a NACK indicating that at least one CB in the corresponding CBG is not received successfully.

At block 1210, the scheduled entity may utilize the communication circuit 542 to receive retransmission of one or more CBGs including CBs corresponding to a negative HARQ feedback. For example, the NACK'ed CBs may be in one or more CBGs that are affected by a bursty interference. Using the CBG definitions similar to that described in FIGS. 9 and 10, retransmission of successfully CBs may be reduced or avoided.

In one configuration, the apparatus 400 and/or 500 for wireless communication includes various means for performance the processed described in relation to FIGS. 6-12. In one aspect, the aforementioned means may be the processor(s) 404/504 shown in FIG. 4/5 configured to perform the functions recited by the aforementioned means. In another aspect, the aforementioned means may be a circuit or any apparatus configured to perform the functions recited by the aforementioned means.

Of course, in the above examples, the circuitry included in the processor 404/504 is merely provided as an example, and other means for carrying out the described functions may be included within various aspects of the present disclosure, including but not limited to the instructions stored in the computer-readable storage medium 406/506, or any other suitable apparatus or means described in any one of the FIGS. 1, 2, 4, 5, 6, and/or 7, and utilizing, for example, the processes and/or algorithms described herein in relation to FIGS. 6-12.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-12 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-12 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one" of a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication operable at a scheduling entity, comprising:
    encoding a transport block (TB) into a plurality of first code blocks (CBs) for transmission in a slot;
    grouping, based on rules included in a code block group (CBG) definition, the plurality of first CBs into a plurality of code block groups (CBGs) that respectively comprise different subsets of the plurality of first CBs, the rules comprising at least one of:
        the CBGs overlapping with each other by one or more CBs such that at least one CB is repeated in adjacent CBGs; or
        each of the plurality of CBGs being restricted to a corresponding symbol of the slot without crossing a symbol boundary; and
    transmitting the plurality of first CB s grouped into the plurality of CBGs.

2. The method of claim 1, further comprising:
    receiving a respective hybrid automatic repeat request (HARQ) feedback for each of the plurality of CBGs; and
    retransmitting a CBG corresponding to a negative HARQ feedback,
    wherein the plurality of CBGs comprise a first CBG, a second CBG, and a third CBG, and the first CBG overlaps with the second CBG and the third CBG, the second CBG and the third CBG each comprising CBs that are not included in the first CBG.

3. The method of claim 1, wherein the plurality of CBGs comprise a first CBG and a second CBG, and the first CBG comprises a different number of CBs than the second CBG.

4. The method of claim 1, further comprising:
    transmitting a message to a user equipment (UE), the message comprising information of the CBG definition; and
    receiving a plurality of second CBs from the UE, the plurality of second CBs grouped, based on the CBG definition, into a plurality of second CBGs comprising at least one of:
        a plurality of CBGs overlapping with each other by one or more CBs; or
        one or more CBGs each restricted to a corresponding symbol,
    wherein the message is configured to indicate the CBG definition stored at the UE.

5. The method of claim 1,
    wherein the CBG definition defines a respective set of time-frequency resources for each of the plurality of CBGs, and
    wherein the respective set of time-frequency resources are defined to align with symbol boundaries of corresponding time domain symbols in the slot.

6. The method of claim 1, wherein the CBG definition comprises:
    a first CBG definition for a control portion of the slot; and
    a second CBG definition that is different from the first CBG definition for a data portion of the slot.

7. A method of wireless communication operable at a user equipment (UE), comprising:
    receiving, from a scheduling entity, information on a code block group (CBG) definition for grouping a plurality of first code blocks (CBs) into a plurality of code block groups (CBGs) that respectively comprise different subsets of the plurality of first CBs; and
    receiving in a slot the plurality of first CBs grouped into the plurality of CBGs based on rules included in the CBG definition, the rules comprising at least one of:
        the CBGs overlapping with each other by one or more CBs such that at least one CB is repeated in adjacent CBGs; or
        each of the plurality of CBGs being restricted to a corresponding symbol of the slot without crossing a symbol boundary; and
    decoding the plurality of first CBs to recover a transport block.

8. The method of claim 7, wherein the plurality of CBGs comprise a first CBG, a second CBG, and a third CBG, and the first CBG overlaps with the second CBG and the third CBG, the second CBG and the third CBG each comprising CBs that are not included in the first CBG.

9. The method of claim 7, further comprising:
    transmitting a respective hybrid automatic repeat request (HARQ) feedback for each of the plurality of CBGs; and
    receiving retransmission of a CBG corresponding to a negative HARQ feedback.

10. The method of claim 7, further comprising:
    transmitting, to the scheduling entity, a plurality of second CB s grouped into a plurality of second CBGs based on the CBG definition;
    receiving a respective hybrid automatic repeat request (HARQ) feedback for each of the plurality of second CBGs; and
    retransmitting a CBG of the plurality of second CBGs corresponding to a negative HARQ feedback.

11. The method of claim 7, wherein the plurality of CBGs comprise a first CBG and a second CBG, and the first CBG comprises a different number of CBs than the second CBG.

12. The method of claim 7, further comprising receiving a message from the scheduling entity, the message comprising the CBG definition.

13. The method of claim 7, further comprising receiving an indicator configured to indicate the CBG definition stored at the UE.

14. The method of claim 7,
wherein the CBG definition defines a respective set of time-frequency resources for each of the plurality of CBGs, and
wherein the respective set of time-frequency resources are defined to align with symbol boundaries of corresponding time domain symbols in the slot.

15. The method of claim 7, wherein the CBG definition comprises:
a first CBG definition for a control portion of the slot; and
a second CBG definition that is different from the first CBG definition for a data portion of the slot.

16. A scheduling entity for wireless communication, comprising:
a communication interface configured for wireless communication;
a memory; and
a processor operatively coupled with the communication interface and the memory, wherein the processor and the memory are configured to:
encode a transport block (TB) into a plurality of first code blocks (CBs) for transmission in a slot;
group, based on rules included in a code block group (CBG) definition, the plurality of first CBs into a plurality of code block groups (CBGs) that respectively comprise different subsets of the plurality of first CBs, the rules comprising at least one of:
the CBGs overlapping with each other by one or more CBs such that at least one CB is repeated in adjacent CBGs; or
each of the plurality of CBGs being restricted to a corresponding symbol of the slot without crossing a symbol boundary; and
transmit the plurality of first CBs grouped into the plurality of CBGs.

17. The scheduling entity of claim 16, wherein the processor and the memory are further configured to:
receive a respective hybrid automatic repeat request (HARQ) feedback for each of the plurality of CBGs; and
retransmit a CBG corresponding to a negative HARQ feedback,
wherein the plurality of CBGs comprise a first CBG, a second CBG, and a third CBG, and the first CBG overlaps with the second CBG and the third CBG, the second CBG and the third CBG each comprising CBs that are not included in the first CBG.

18. The scheduling entity of claim 16, wherein the plurality of CBGs comprise a first CBG and a second CBG, and the first CBG comprises a different number of CBs than the second CBG.

19. The scheduling entity of claim 16, wherein the processor and the memory are further configured to:
transmit a message to a user equipment (UE), the message comprising information of the CBG definition; and
receive a plurality of second CBs from the UE, the plurality of second CBs grouped, based on the CBG definition, into a plurality of second CBGs comprising at least one of:
CBGs overlapping with each other by one or more CBs; or
one or more CBGs each restricted to a corresponding symbol,
wherein the message is configured to indicate the CBG definition stored at the UE.

20. The scheduling entity of claim 16,
wherein the CBG definition defines a respective set of time-frequency resources for each of the plurality of CBGs, and
wherein the respective set of time-frequency resources are defined to align with symbol boundaries of corresponding time domain symbols in the slot.

21. The scheduling entity of claim 16, wherein the CBG definition comprises:
a first CBG definition for a control portion of the slot; and
a second CBG definition that is different from the first CBG definition for a data portion of the slot.

22. A user equipment (UE) for wireless communication, comprising:
a communication interface configured for wireless communication;
a memory; and
a processor operatively coupled with the communication interface and the memory, wherein the processor and the memory are configured to:
receive, from a scheduling entity, information on a code block group (CBG) definition for grouping a plurality of first code blocks (CBs) into a plurality of code block groups (CBGs) that respectively comprise different subsets of the plurality of first CBs; and
receive in a slot the plurality of first CBs grouped into the plurality of CBGs based on rules included in the CBG definition, the rules comprising at least one of:
the CBGs overlapping with each other by one or more CBs such that at least one CB is repeated in adjacent CBGs; or
each of the plurality of CBGs being restricted to a corresponding symbol of the slot without crossing a symbol boundary; and
decode the plurality of first CBs to recover a transport block.

23. The UE of claim 22, wherein the plurality of CBGs comprise a first CBG, a second CBG, and a third CBG, and the first CBG overlaps with the second CBG and the third CBG, the second CBG and the third CBG each comprising CBs that are not included in the first CBG.

24. The UE of claim 22, wherein the processor and the memory are further configured to:
transmit a respective hybrid automatic repeat request (HARQ) feedback for each of the plurality of CBGs; and
receive retransmission of a CBG corresponding to a negative HARQ feedback.

25. The UE of claim 22, wherein the processor and the memory are further configured to:
transmit, to the scheduling entity, a plurality of second CBs grouped into a plurality of second CBGs based on the CBG definition;
receive a respective hybrid automatic repeat request (HARQ) feedback for each of the plurality of second CBGs; and
retransmit a CBG of the plurality of second CBGs corresponding to a negative HARQ feedback.

26. The UE of claim 22, wherein the plurality of CBGs comprise a first CBG and a second CBG, and the first CBG comprises a different number of CBs than the second CBG.

27. The UE of claim 22, wherein the processor and the memory are further configured to:
receive a message from the scheduling entity, the message comprising the CBG definition.

28. The UE of claim 22, wherein the processor and the memory are further configured to:
  receive an indicator configured to indicate the CBG definition stored at the UE.

29. The UE of claim 22,
  wherein the CBG definition defines a respective set of time-frequency resources for each of the plurality of CBGs,
  wherein the respective set of time-frequency resources are defined to align with symbol boundaries of corresponding time domain symbols in the slot.

30. The UE of claim 22, wherein the CBG definition comprises:
  a first CBG definition for a control portion of the slot; and
  a second CBG definition that is different from the first CBG definition for a data portion of the slot.

* * * * *